United States Patent [19]
Shifrin

[11] 3,939,347
[45] Feb. 17, 1976

[54] TWO DIMENSIONAL DISPLAY OF DETECTOR RESPONSE

[75] Inventor: Gordon A. Shifrin, Malibu, Calif.

[73] Assignee: The United States of America as represented by the Secretary of the Navy, Washington, D.C.

[22] Filed: Nov. 5, 1974

[21] Appl. No.: 520,991

[52] U.S. Cl............... 250/334; 250/338; 324/73 R; 324/158 R
[51] Int. Cl.² ................. H01J 31/49; G01R 15/12
[58] Field of Search .......... 250/334, 338, 332, 333, 250/341, 343, 495, 458; 324/158 R, 73 R; 313/380

[56] References Cited
UNITED STATES PATENTS

| | | | |
|---|---|---|---|
| 2,262,942 | 11/1941 | Jones | 250/338 |
| 2,980,763 | 4/1961 | Lasser | 250/334 |
| 3,056,062 | 9/1962 | Garbuny et al. | 313/380 |
| 3,239,605 | 3/1966 | Cholet et al. | 250/334 |
| 3,596,097 | 7/1971 | Robillard | 250/333 |
| 3,830,970 | 8/1974 | Hurley | 250/334 |
| 3,857,035 | 12/1974 | Miller | 250/334 |

Primary Examiner—Harold A. Dixon
Attorney, Agent, or Firm—R. S. Sciascia; R. F. Beers; R. Schneider

[57] ABSTRACT

A contour plotter for testing the response of an infrared detector comprising a small, cathode-ray tube with a hidden electron gun for generating a flying-hot-spot raster, a refracting, optical lens for focussing a reduced image of this raster on the detector under test, an oscilloscope, a two-dimensional sweep generator for sweeping the oscilloscope and the small, cathode ray tube in synchronism, and an electronic amplifier for applying the output of the detector to the Z-axis of the oscilloscope so that the intensity of the oscilloscope scanning beam is varied in accordance with the detector output response.

In one embodiment, the small, cathode-ray tube uses an infrared phosphor screen to produce a small source of radiation. In a second embodiment, the cathode-ray tube uses a thin membrane screen formed by a thin film dielectric substrate with a refractory metal film deposited on it for producing a flying hot spot.

15 Claims, 3 Drawing Figures

TWO DIMENSIONAL DISPLAY OF DETECTOR RESPONSE

BACKGROUND OF THE INVENTION

1. Field of the Invention

The present invention is related generally to radiation imaging systems and, in particular, to an apparatus for testing radiation detector response.

2. Description of the Prior Art

Conventional contour plotters used for testing the response characteristic of radiation detectors are cumbersome and difficult to use. Generally, they employ a two-dimensional, mechanical-displacement device which is operated manually on a point-by-point basis. Such conventional plotters use a temperature-calibrated black body as a source for radiation, and a readout is performed manually on a meter. Since black bodies, when set at a predetermined temperature, send out photon radiation in a known amount, the number of photons per unit solid angle may be calculated. Thus the detector response versus photon impingement may be determined.

SUMMARY OF THE INVENTION

Briefly, a contour plotter is disclosed which performs automatically many of the functions of a conventional plotter, but with improved speed and flexibility. The plotter comprises a raster in the form of a flying hot spot generated by electron beam interaction with a target plate, an optical system for focusing a reduced image of the raster on the infrared detector under test, an oscilloscope-type, imaging system, a sweep generator for driving the raster and the oscilloscope-type imager, and a means for applying the detector output response to the oscilloscope-type imager so that the intensity of the scope pattern is modulated by the signal level of the detector output. Thus a two-dimensional display is produced whose intensity at any point represents the corresponding response of the detector to the imaged spot.

OBJECTS OF THE INVENTION

An object of the present invention is to perform the functions of an infrared-detector contour plotter automatically.

A further object is to improve the speed and flexibility of the infrared-detector, contour plotters.

Other objects, advantages and novel features of the present invention will become apparent from the following detailed description of the invention when considered in conjunction with the accompanying drawing.

DETAILED DESCRIPTION OF THE INVENTION

Figure 1:
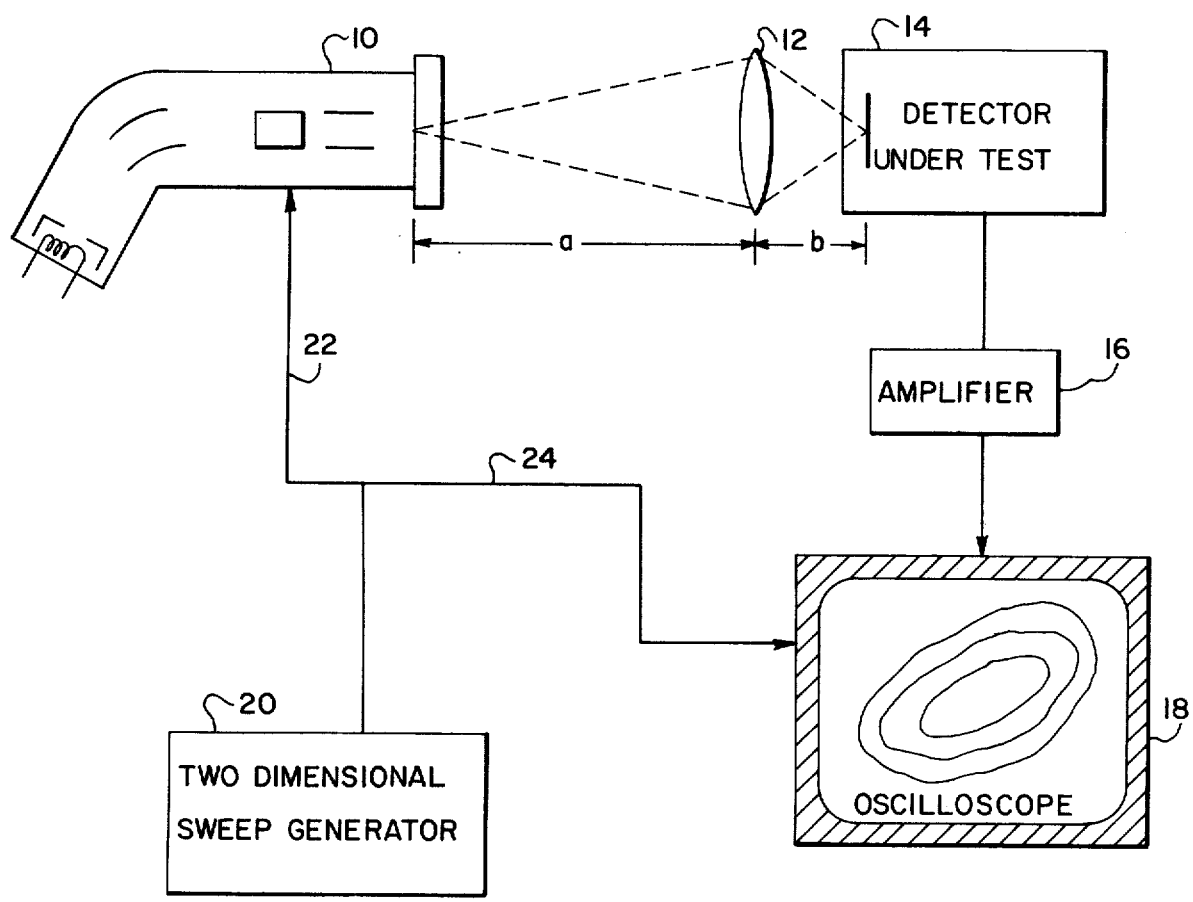
FIG. 1 is a block diagram of the basic 2-dimensional system of the contour plotter of the present invention.

Referring now to the drawings, FIG. 1 shows the basic two-dimensional display for testing a radiation detector's response. A raster in the form of a flying hot spot is generated by the interaction of an electron beam with a target screen in the device 10. This flying hot spot serves as a source of radiation which is focussed on the radiation detector 14 under test. This focusing may be accomplished by an appropriate refractive lens 12 (as shown in FIG. 1) or with a reflective focusing system. If a refractive-lens focusing system is used, the lens material must be suitable for transmitting the wave length band of interest. For example, if an infrared detector is to be tested, a silicon lens is appropriate.

The focusing system is generally positioned so that the radiation is focused in a smaller and more intense (minified) spot than the original emission from the raster-generating device 10. If a refractive lens 12 is used as shown in the figure, then the radiation received at the detector is reduced in size and is made more intense than that generated at the device 10 by making the distance b between the lens 12 and the detector 14 smaller than the distance a between the device 10 and the lens 12.

The detector 14 under test produces an electrical output in response to this focused, reduced image of the raster on its radiation-sensing face. This electrical output is amplified by a suitable electronic amplifier 16 and then fed to the Z-axis of a luminous, image-producing device such as the oscilloscope 18. This Z-axis connection permits the intensity of the scope pattern of the oscilloscope 18 to be modulated by the signal level of the detector output.

A two-dimensional, sweep generator 20 is provided to drive, in synchronism, the sweep of oscilloscope 18 via the line 24 and the sweep of the raster-generating device 10 via the line 22. In this manner a two-dimensional display is produced whose intensity at any point represents the corresponding response of the detector to the imaged spot. This type of scope display may be easily photographed.

Figure 2:
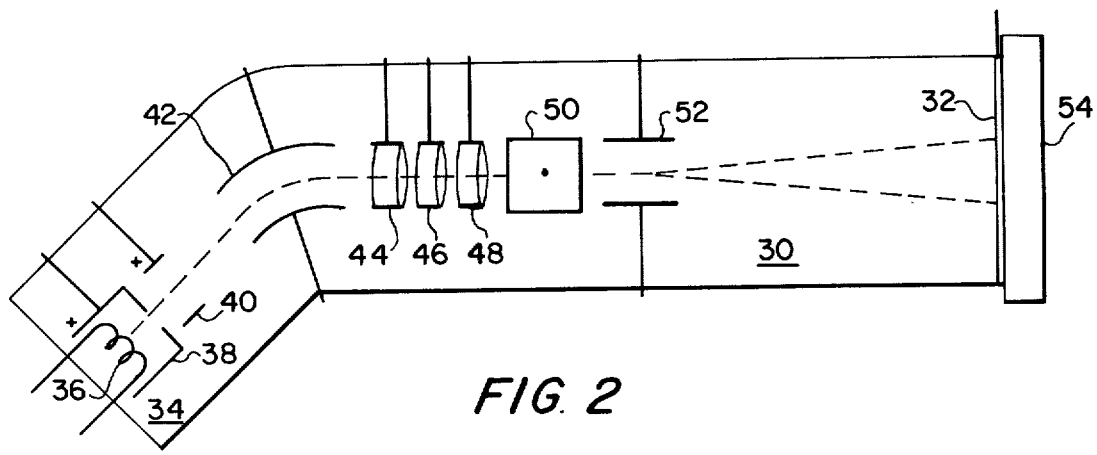
FIG. 2 is a schematic illustration of one embodiment of the cathode-ray tube that may be used to implement the present invention.

FIG. 2 illustrates one type of flying-hot-spot raster-generating device 10 that may be used to implement the system of FIG. 1. It is essentially a small, glass-encased, evacuated, cathode-ray tube 30 with an infrared phosphor screen 32 and a hidden electron gun 34. The gun is hidden from the target screen 32 to prevent a direct view of the hot cathode 36 of the gun 34. Electrons are drawn from the hot cathode 36 via the aperture electrodes 38 and the extraction electrodes 40 in the conventional manner and are turned through an arc by the curved electrodes 42. The electron beam then passes through a set of three cylindrical beam-shaping electrodes 44, 46 and 48. The electric potentials on these three electrodes are chosen so that a focusing of the electron beam is effected. The potential on electrode 46 is negative with respect to that on electrodes 44 and 48 by an amount necessary to achieve focus at the particular accelerating potential used for the electron beam.

After passing through this set of focusing electrodes, the electron beam passes through a set of deflection plates 50 and 52 which, when suitably driven by the two-dimensional sweep generator 20, will generate the desired raster. Electrodes 50 act as the horizontal deflection plates while the electrodes 52 act as the vertical deflection plates.

A window 54 is located at the end of the tube 30. On this window is deposited a layer 32 of a material which, when excited by the electron beam, radiates in the desired detector wavelength band. If the detector under test is an infrared detector, then an infrared phosphor screen layer 32 may be deposited on the window. Good candidates for such a phosphor deposit are the powdered forms of the III-V compounds that are used to make the infrared detectors such as InSb. Cooling of this material might be necessary before a significant amount of the desired radiation may be extracted from such materials in the 3 to 5 micron band. (Such cooling essentially would quench out undesirable radiation). Where such cooling is applied, it will be necessary to separate the phosphor screen from the window to prevent frosting. The phosphor could be laid down on a transparent substrate of good thermal conductivity (such as sapphire) and cooled with liquid nitrogen, for example, through double-walled tubing which penetrates the wall of the tube. Likewise, the window 54 must be chosen so that it transmits the radiation band of interest. Again, if an infrared detector is being tested, a silicon window would be suitable.

Thus, an electron beam is utilized to excite a deposited layer such as infrared phosphor to produce a small source of radiation at the point of interaction which can be swept over a prescribed area by a corresponding sweeping of the electron beam by its deflection plates 50 and 52. The size of the radiation-source hot-spot and its intensity are controllable through the size and energy of the electron beam. The size and energy of the electron beam are in turn controllable by varying the voltages on the focussing electrodes 44, 46 and 48 and the aperture and extraction electrodes 38 and 40 in the conventional manner. This control over the hot spot permits (with optics of good quality) the production of spots small enough to achieve the diffraction limit on a minified spot seen by the detector 14. This control gives the further advantage that, by being able to vary the intensity of the spot, particular features of the detector response contours may be brought out. For example, a low-intensity spot would show more detail in the more sensitive portions of the detector while a high-intensity spot would emphasize less sensitive outlying areas so that they may be seen.

Another advantage to this configuration is that since the area scanned by the raster is electronically controllable, there is great flexibility as to its size and shape. Thus, detector elements and arrays may be examined in virtually unlimited variety.

Figure 3:
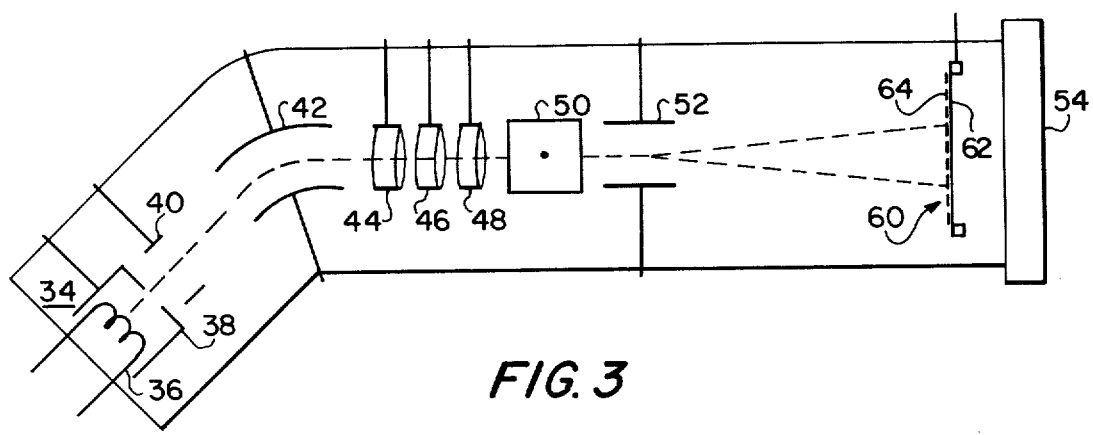
FIG. 3 is a schematic illustration of a second embodiment of the cathode-ray tube that may be used to implement the present invention.

FIG. 3 illustrates a second version of the flying-hot-spot raster-generating device 10 that may be used to implement the system of FIG. 1. As in FIG. 2 the device is essentially a small, cathode ray tube. It differs from the device of FIG. 2 only that the hot spot is generated through local heating of a membrane 60. This membrane 60 is located just inside the window 54. In all other respects the device is similar to that of FIG. 2.

The membrane 60 of FIG. 3 is comprised of two parts: (a) a thin film dielectric substrate 62 and (b) a refractory metal film 64 deposited on this substrate. Such films are currently manufactured by Hughes Aircraft and may comprise, for example, a self-supporting aluminum oxide substrate of about 1,000A thick with an evaporated film of molybdenum or tungsten of the order of 200A to 500A thick. Both the aluminum oxide substrate and the evaporated refractory film are capable of withstanding high operating temperatures, possibly as high as 2,000°K. Consequently, substantial power levels can be radiated from the membrane. Such high temperatures may produce outgassing which eventually could degrade the vacuum level within the sealed tube. To pump such undesirable gas, getters should be provided within the tube so that upon their activation adequate vacuum is restored for a subsequent period of operation.

When using the tube configuration of FIG. 3, the thin, heated membrane 60 must be carefully designed to avoid problems with membrane, response speed resolution. For instance, since thermal conduction of the metal film deposit generally exceeds that of the dielectric substrate, the membrane design must be such that the heat lost by radiation is as large as possible relative to that lost in other parts of the membrane by thermal conduction. To achieve this the metal film deposit must be quite thin (on the order of 200A). Dielectric substrates thinner than 1,000A may also be necessary to increase the speed of response much beyond one or two frames per second (to facilitate better image continuity on the o-cilloscope). In the same manner the size of the hot spot on the membrane may be adjusted since the effective spot size is a function of the rate at which heat is lost by thermal conduction to the surrounding parts of the membrane. Thus the same factors which improve speed may be used to improve resolution.

The proposed contour plotters will operate in a manner different from conventional plotters, but to some extent the two types of plotters will be complementary. With the proposed devices the contours will be obtained quickly and easily so that 100% inspection of completed arrays should be practical. On the other hand the proposed sources of radiation are not standardized black body radiators with virtually 100% emissivity. Consequently, interpreting the contours with respect to some specified D* values will not be simple, but will be capable of calibration by comparison with parallel conventional procedures. Also, the output will not be a contour plot in the conventional manner but will be a display in which the intensity varies continuously. Thus, quantitative evaluation will be more difficult. On the other hand, comparison of all elements within an array will be greatly facilitated.

Obviously, many modifications and variations of the present invention are possible in light of the above teachings. It is therefore to be understood that, within the scope of the appended claims, the invention may be practiced otherwise than as specifically described.

What is claimed is:

1. A detector contour plotter for testing the response of a detector to a stimulus comprising:
    thin-film target means including an infra-red phosphor screen for emitting infrared radiation when excited;
    means for generating a raster on said thin-film target means so that a point source of infrared radiation is emitted from the opposed side of said target means and is swept over a prescribed area;
    focusing means for focusing an image of said raster on the detector under test;
    cathode-ray imaging means having a two-dimensional scan which is driven in synchronism with said raster; and
    means for applying the output response of the detector under test to said cathode-ray imaging means to control the intensity of its scanning beam in accordance with said detector output response.

2. A detector contour plotter as defined in claim 1, wherein said raster-generating means further comprises a two-dimensional, sweep generator for driving both the cathode-ray imaging system and the raster scan in synchronism.

3. A detector contour plotter as defined in claim 1, wherein said detector output-applying means is an electronic amplifier.

4. A detector contour plotter as defined in claim 1, wherein said cathode-ray imaging system comprises an oscilloscope.

5. A detector contour plotter as defined in claim 1, wherein said focusing means is an appropriately positioned refractive lens.

6. A cathode-ray tube for generating radiation of the appropriate frequency band to test an infrared detector comprising:
   electron-beam generating means;
   beam-curving, electrode plate means for curving the electron beam generated by said electron beam generating means;
   beam-shaping electrode means situated so as to focus the beam into a desired shape;
   thin, infrared light emissive phosphor screen means;
   deflection means for scanning said electron beam across a prescribed area on said phosphor screen means so that a source of infrared radiation is swept over a prescribed area on the opposed side of said phosphor screen means, and
   window means for transmitting the desired band of frequencies generated by the interaction of the electron beam with said phosphor screen means.

7. A cathode-ray tube for generating radiation of the appropriate frequency band to test an infrared detector comprising:
   electron-beam generating means,
   beam-curving, electrode means for curving the electron beam generated by said electron beam-generating means;
   beam-shaping, electrode means situated so as to focus the beam into a desired shape;
   thin-membrane, screen means formed by a thin-film dielectric substrate with a refractory metal film deposited on it; and
   deflection means for scanning said electron beam across a prescribed area on said membrane screen means so that a hot spot of infrared radiation generated by said beam on said screen means is swept over a prescribed area.

8. A detector contour plotter for testing the response of a detector to a stimulus comprising:
   means for generating a raster in the form of a flying hot spot of infrared radiation on a target, said raster-generating means including a cathode-ray tube with a hidden electron gun, said target including a thin-film membrane capable of forming a hot spot of infrared radiation in the desired region of the spectrum on the opposed side thereof when said thin-film membrane is locally heated by the electron beam of said cathode ray tube;
   focusing means for focusing an image of said raster on the detector under test;
   cathode-ray imaging means having a two-dimensional scan which is driven in synchronism with said raster; and
   means for applying the output response of the detector under test to said cathode-ray imaging means to control the intensity of its scanning beam in accordance with said detector output response.

9. A detector contour plotter as defined in claim 8, wherein said thin film membrane comprises:
   a thin-film dielectric substrate; and
   a refractory metal film deposited on said dielectric substrate.

10. A cathode-ray tube for generating radiation of the appropriate frequency band to test an infrared detector comprising:
    electron-beam generating means;
    beam-curving, electrode plate means for curving the electron beam generated by said electron beam generating means;
    beam-shaping electrode means situated so as to focus the beam into a desired shape;
    infra-red phosphor screen means;
    deflection means for scanning said electron beam across a prescribed area on said phosphor screen means so that a source of infrared radiation is swept over a prescribed area on the opposed side of said phosphor screen means; and
    silicon window means for transmitting the desired band of frequencies generated by the interaction of the electron beam with said phosphor screen means.

11. A method for plotting the contours of a radiation detector under test comprising the steps of:
    generating a raster with an electron beam on a thin-membrane screen formed by a thin-film dielectric substrate with a refractory metal film deposited thereon;
    focusing the radiation from the point source on to the face of the radiation detector under test;
    driving a cathode-ray imaging means in synchronism with said raster; and
    applying the output response of the detector under test to said cathode-ray imaging means to control the intensity of its scanning beam in accordance with said detector output response.

12. A method for plotting the contours of a radiation detector under test comprising the steps of:
    generating a raster on an extremely thin film infrared emissive target so that a point source of infrared radiation is emitted from the opposed side of the film;
    focusing the radiation from the point source on to the face of the radiation detector under test;
    driving a cathode-ray imaging means in synchronism with said raster; and
    applying the output response of the detector under test to said cathode-ray imaging means to control the intensity of its scanning beam in accordance with said detector output response.

13. A method for plotting the contours of a radiation detector under test as defined in claim 12, wherein said step of generating a raster comprises the steps of:
    generating an electron beam; and
    scanning said electron beam across a thin-membrane screen formed by a thin-film dielectric substrate with a refractory metal film deposited thereon.

14. A method for plotting the contours of a radiation detector under test as defined in claim 12, wherein said step of generating a raster comprises the steps of:
    generating an electron beam; and
    scanning said electron beam across an extremely thin infrared phosphor screen.

15. A detector contour plotter for testing the response of a detector to a stimulus comprising:
    means for generating a raster in the form of a flying hot spot of infrared radiation on an infrared, phosphor screen, said raster generating means including a cathode-ray tube with a hidden electron gun, said phosphor screen having a window on the side opposed to said electron gun for transmitting the radiation in the infrared frequency band of the detector under test;

focusing means for focusing an image of said raster on the detector under test;

cathode-ray imaging means having a two-dimensional scan which is driven in synchronism with said raster; and means for applying the output response of the detector under test to said cathode-ray imaging means to control the intensity of its scanning beam in accordance with said detector output response.

* * * * *